United States Patent
De La Houssaye et al.

(10) Patent No.: US 8,309,371 B1
(45) Date of Patent: Nov. 13, 2012

(54) SYSTEM AND METHOD FOR CREATING A FLAT WAVEFRONT USING A PHOTONIC CRYSTAL

(75) Inventors: Paul R. De La Houssaye, San Diego, CA (US); J. Scott Rodgers, Arlington, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 655 days.

(21) Appl. No.: 12/506,932

(22) Filed: Jul. 21, 2009

(51) Int. Cl.
 *H01L 21/027* (2006.01)
 *G03F 7/00* (2006.01)
 *H01S 3/05* (2006.01)

(52) U.S. Cl. .......... 438/7; 438/8; 430/311; 430/312; 430/313; 430/314; 430/315; 430/316; 359/346

(58) Field of Classification Search .......... 359/346; 438/7, 8; 430/311–316, 321–324
See application file for complete search history.

(56) References Cited

U.S. PATENT DOCUMENTS

| | | | |
|---|---|---|---|
| 6,093,941 A * | 7/2000 | Russell et al. | 257/103 |
| 6,103,540 A * | 8/2000 | Russell et al. | 438/22 |
| 2002/0045136 A1 * | 4/2002 | Fritze et al. | 430/322 |
| 2002/0084869 A1 * | 7/2002 | White | 333/159 |
| 2006/0249804 A1 * | 11/2006 | Mouli | 257/432 |
| 2007/0287100 A1 * | 12/2007 | Mizutani et al. | 430/311 |
| 2008/0238810 A1 * | 10/2008 | Winsor | 343/911 R |
| 2008/0291101 A1 * | 11/2008 | Braunstein et al. | 343/754 |

* cited by examiner

*Primary Examiner* — Eric Bolda
(74) *Attorney, Agent, or Firm* — Ryan J. Friedl; Kyle Eppele

(57) ABSTRACT

A system and method include forming an optical cavity by positioning a photonic crystal a predetermined distance from a substrate, and creating, within the cavity, a standing wave having a substantially flat wavefront. The standing wave may be created by applying an input wave to a first surface of the photonic crystal. The predetermined distance may be such that a peak intensity of the standing wave is proximate to or a calculated distance from the substrate surface. The peak intensity may vary in relation to the substrate surface. The method may include tuning the peak intensity location within the cavity by shifting the wavelength of the input wave or altering the characteristics of the photonic crystal by an external field. A second photonic crystal may be used on the other side of the substrate to replace the reflecting properties of the substrate, allowing for further smoothing of the wavefront.

30 Claims, 8 Drawing Sheets

SYSTEM AND METHOD FOR CREATING A FLAT WAVEFRONT USING A PHOTONIC CRYSTAL

FEDERALLY SPONSORED RESEARCH AND DEVELOPMENT

The System and Method for Creating a Flat Wavefront Using a Photonic Crystal is assigned to the United States Government and is available for licensing for commercial purposes. Licensing and technical inquiries may be directed to the Office of Research and Technical Applications, Space and Naval Warfare Systems Center, Pacific, Code 2112, San Diego, Calif., 92152; voice (619) 553-2778; email ssc_pac_T2@navy.mil., reference Navy Case No. 97479.

BACKGROUND

As dimensions and feature sizes shrink in the world of devices and MEMS, lithography becomes a critical part of the fabrication of the device. One of the critical limiting factors in lithography is the limited depth of field of many optical systems. Patterns need to be imaged onto as flat a surface as possible. Further, when crystal layers or other layered structures are grown on top of one another, it is critical that the starting material be nearly perfectly flat at the atomic level.

Chemical-mechanical polishing exists as the only predominant method for flattening a substrate surface. However, such process is a rather crude, dirty process that requires grinding in the presence of a slurry. Another method used to flatten a substrate surface involves the filling in of the valleys by spinning on a liquid material that has similar etch characteristics to the substrate and then etching the combination of the two. A major drawback of this process is that it fails badly when features with a long wavelength period are involved.

A need exists for a system and method that may be used, among other applications, to flatten a substrate surface.

DETAILED DESCRIPTION OF SOME EMBODIMENTS

Figure 1:
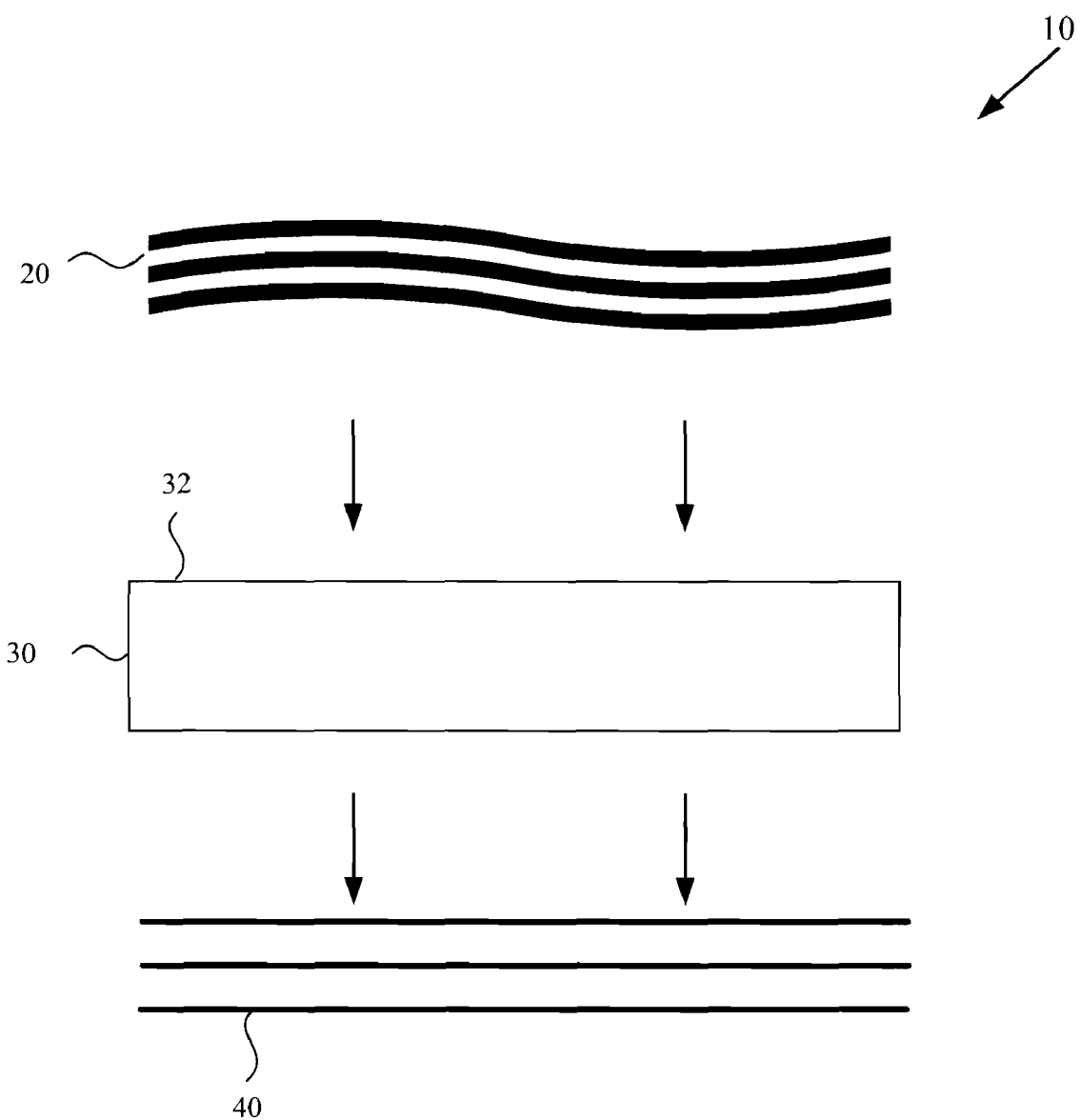
FIG. 1 shows a diagram of an embodiment of a system for creating a flat wavefront in accordance with the System and Method for Creating a Flat Wavefront Using a Photonic Crystal.

FIG. 1 shows a diagram of an embodiment of a system 10 in accordance with the System and Method for Creating a Flat Wavefront Using a Photonic Crystal. System 10 includes an input wave 20, a photonic crystal 30, and an output wave 40. Input wave may be a wave with a wavelength ranging from approximately 500 nm to 10 cm.

A photonic crystal is an engineered material with unique optical properties resulting from the periodic structure of the dielectric materials that form the crystal. At a given wavelength, light (defined in this document to include any electromagnetic radiation with a wavelength that is in the range specified above) is only allowed to propagate in specific directions within the crystal. In system 10, photonic crystal 30 acts as a spatial frequency filter, removing any spatial frequency components that are not allowed to propagate in a given direction through the crystal. A wavefront composed of multiple spatial frequency components that is incident on a photonic crystal which is designed to allow only spatial frequencies normal to its surface, will be flattened, as the photonic crystal will remove any transverse spatial frequencies components, producing a wavefront with flat phase fronts.

One simple example of this waveform transformation would be light from a point source that is relatively close to the photonic crystal being imaged by the photonic crystal in such a way that it would appear to be at an infinite distance and at a location that is perpendicular to the crystal surface. Photonic Crystals that are similar to those which may be used within system 10 are described in the book by Joannopoulos, Meade, and Winn, "Photonic Crystals: Molding the Flow of Light", Princeton University Press (1995), the content of which is incorporated by reference herein.

As shown by the arrows above photonic crystal 30, input wave 20 is applied to a first surface 32 of photonic crystal 30. Photonic crystal 30 is configured to pass or reflect waves. Photonic crystal 30 is configured to allow waves parallel to first surface 32 to pass through. That portion of the input wave that is comprised of transverse spatial components are not allowed within photonic crystal 30, and thus are completely filtered out, if one assumes an infinite perfect photonic crystal 30. In this case they are substantially filtered out. Output wave 40 is thus an ultra-flat plane wave having local and long-range flatness. The characteristics of output wave 40 are a function of the configuration of photonic crystal 30. For example, in one embodiment, a photonic crystal 30 having the requisite three-dimensional periodic design structure will produce an output wave 40 having a flat phase front when presented with an input wave 20 that has at least some phase variations as a function of the location along the crystal surface 32.

Figure 2A:
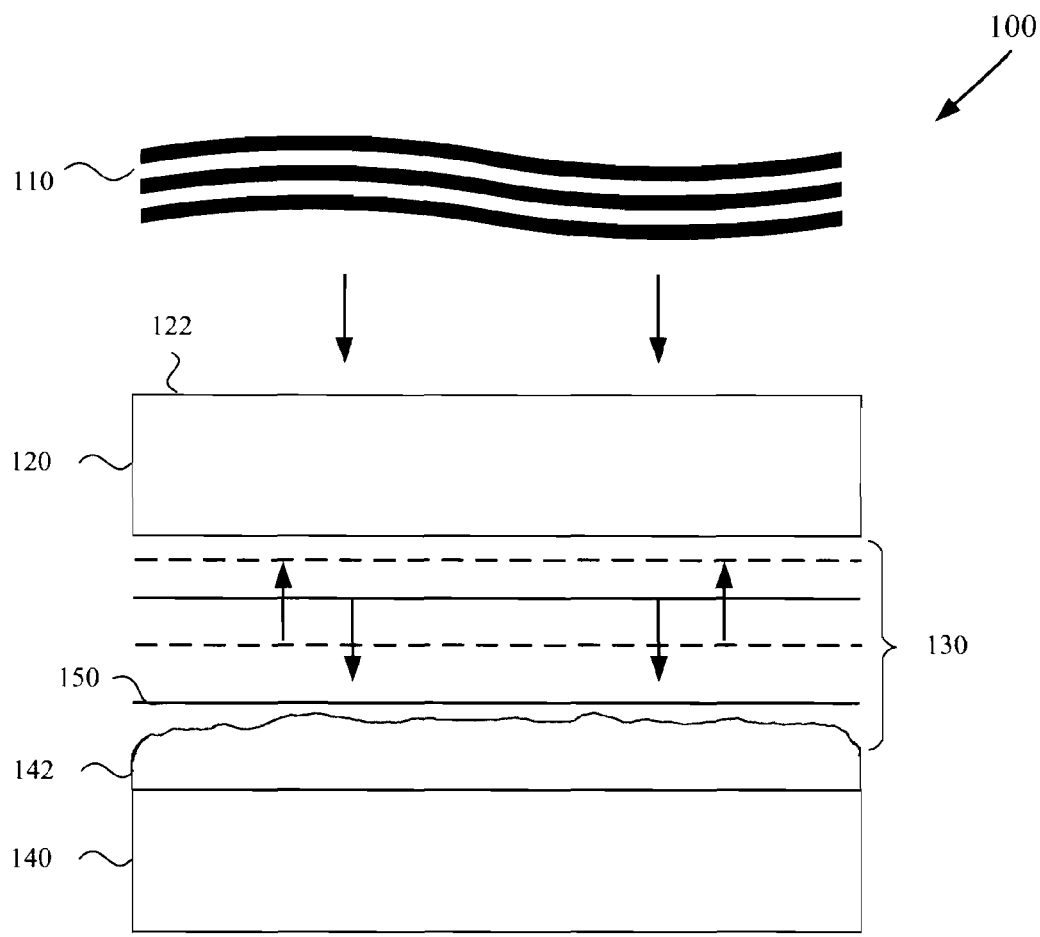
FIG. 2A shows a diagram of an embodiment of a system for flattening the surface of a substrate with a flat wavefront in accordance with the System and Method for Creating a Flat Wavefront Using a Photonic Crystal.
Figure 2B:
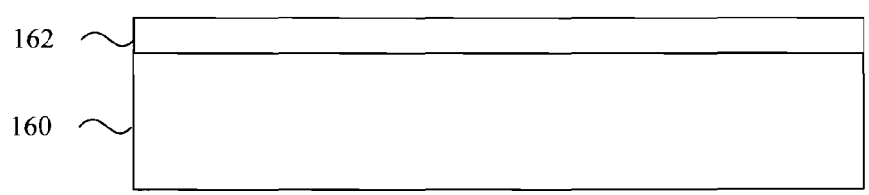
FIG. 2B shows a diagram of a substrate having a surface flattened by a wavefront in accordance with the System and Method for Creating a Flat Wavefront Using a Photonic Crystal.

FIGS. 2A and 2B show diagrams of an embodiment of a system 100 in accordance with the System and Method for Creating a Flat Wavefront Using a Photonic Crystal. System 100 includes an input wave 110, a photonic crystal 120, an optical cavity 130, and a substrate 140. As an example, input wave 110 and photonic crystal 120 may be configured the same as in system 10.

In some embodiments, photonic crystal 120 may include other elements, such as a surface coating that is at least partially reflective, on either the top or bottom of the photonic crystal. Such a surface coating may be used to assist in the formation of optical cavity 130 and/or to improve the characteristics of optical cavity 130. In some embodiments, the surface coating is partially reflective. In other embodiments, the surface coating is fully reflective. For example, photonic crystal 120 may have a thin surface coating of aluminum that is partially reflective, or, a thicker surface coating of aluminum that is fully reflective. It should be noted that other partially or fully reflective surface coating materials, such as other metallic materials such as gold or silver or non-metallic materials such as silica, may be used as recognized by one having ordinary skill in the art. In other embodiments, photonic crystal 120 may in addition have as part of it, an antireflection coating to better couple input wave 110 into optical cavity 130.

Substrate 140 includes a surface 142 to be flattened. Substrate 140 may comprise any substrate to be flattened. As an example, substrate 140 may comprise a semiconductor wafer. In some embodiments, surface 142 may be a silicon-dioxide layer or glass, a material that is photochemically active such as photoresist, or a material that has within it part of a sequence of reactions that are photocatalyzed or otherwise photoactivated.

In another embodiment, the cavity may have within it some material and/or gas that is photochemically activated or catalized such that the etching properties of surface 142 are enhanced (or reduced) in the presence of light. In still yet another embodiment, the cavity may have within it some material and/or gas that is photoreactive in such a manner as to cause material to be deposited on surface 142 at a rate that is dependent upon the intensity of the wave near or at the surface (which would vary given an uneven or rough surface.)

In some embodiments, substrate 140 is at least partially transparent. However, substrate 140 comprises some layer (or layers in concert) that is/are reflective enough to set up a standing wave within optical cavity 130, whether the same as, proximate to, or separate from surface 142. FIG. 2A shows surface 142 prior to being flattened. FIG. 2B shows a substrate 160 having a flattened surface 162. Substrate 160 and surface 162 represent the final version of substrate 140 and surface 142 after an etch process, such as is described in process 600 discussed herein with reference to FIG. 7.

As shown by the arrows, input wave 110 is applied to the surface 122 of photonic crystal 120. Photonic crystal 120 is configured to output waves into optical cavity 130. In some embodiments, optical cavity 130 may comprise a Fabry-Perot cavity. In some embodiments, optical cavity 130 comprises the space between photonic crystal 120 and substrate 140. In some embodiments, optical cavity 130 also comprises a portion of the substrate itself. The waves reflect off of surface 142, as shown by the arrows within optical cavity 130, or may reflect off surface 140, or some surface or other reflective elements that are comprised on or within substrate 140.

The interference of the waves within optical cavity 130 produces one or more standing waves having a peak intensity 150. The location of peak intensity 150 of the standing wave may vary within optical cavity 130. For example, in some embodiments, peak intensity 150 of the standing wave may be located within optical cavity 130 proximate to substrate 140. In other embodiments, peak intensity 150 of the standing wave may be located within optical cavity 130 a calculated distance from substrate 140. In some embodiments, peak intensity 150 of the standing wave may be located within optical cavity 130 within or beneath surface 142 of substrate 140. Still in other embodiments, peak intensity 150 of the standing wave may vary in relation to the surface of the substrate. As an example, if the wavelength of input wave 110 is varied, peak intensity 150 of the standing wave in relation to the surface of substrate 140 will also vary.

In other embodiments of system 100, the location of peak intensity 150 of the standing wave within optical cavity 130 may be tuned. For example, such tuning may occur by shifting the wavelength of input wave 110. As another example, such tuning may occur by altering the characteristics of photonic crystal 120 by an external field acting as a controlling field, such as light at a different frequency from that comprising input wave 110 or another an electromagnetic field, electric field, etc.

One or more of these peak intensity 150 locations may be used to the purposes described herein. For example, substrate 140 may comprise a second backside layer to be flattened before that portion of substrate 140 designed to at least partially reflect the light from input wave 110.

Additionally, in some embodiments, substrate 140 may comprise multiple reflective surfaces, at least some partially or fully reflective, and comprise gaps or be at least partially non-contiguous, or contain multiple surfaces to be flattened. In all cases, however, the sum of the actions of all reflective surfaces will cause at least one standing wave to be formed inside cavity 130.

It should be noted that references to a peak intensity of the standing wave in the optical cavity relate primarily to a clear indication of the intensity fluctuations as a function of location of the standing wave within the cavity. The various methods that are described herein that denote for example, an etch, deposition, or photoactive (for later processing to complete the flattening process), or other processes that might take advantage of the flatness of the phase and amplitude of the wavefront, may likely depend upon the details of the wave intensity in the cavity. Nothing in this description or in the claims are to be interpreted as a limitation in this respect, as the peak intensity of the wavefront may be used herein as a clear way of visualizing the complete description of the fine structure or details of the standing wave within the cavity.

It should also be noted that the standing wave described within the optical cavity refers to that portion of the wavefront that is a standing wave. Nothing within this description or the claims should be interpreted as disallowing the possibility of non-standing components of the wave in the optical cavity. In many embodiments, it is likely that such components will also exist within the optical cavity.

Figure 3:
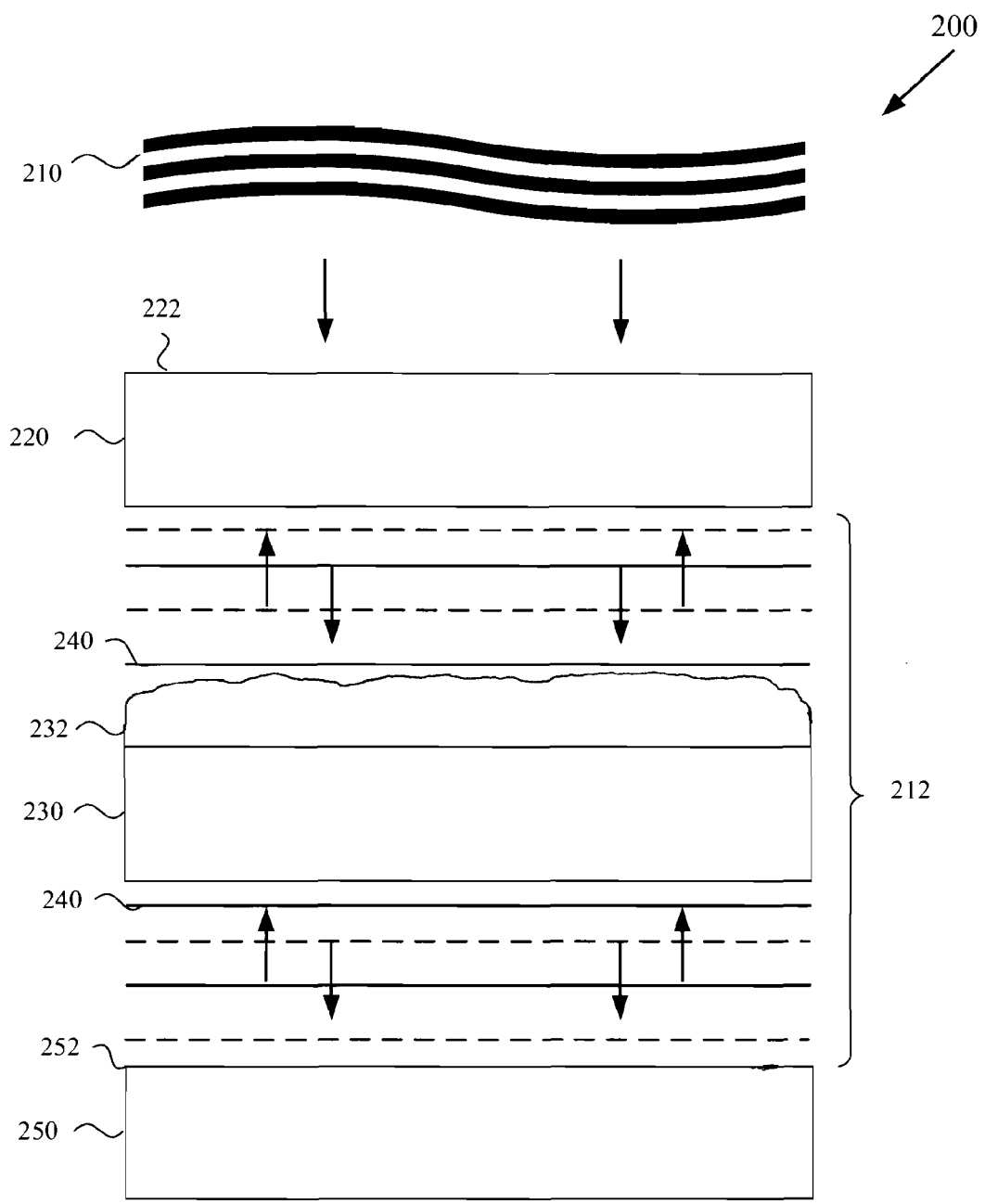
FIG. 3 shows a diagram of an embodiment of a system for flattening the surface of a substrate using two photonic crystals in accordance with the System and Method for Creating a Flat Wavefront Using a Photonic Crystal.

FIG. 3 shows a diagram of an embodiment of a system 200 in accordance with the System and Method for Creating a Flat Wavefront Using a Photonic Crystal. System 200 includes an input wave 210, a photonic crystal 220, a substrate 230, one or more standing waves having a peak intensity 240, and a second photonic crystal 250. As an example, input wave 210 photonic crystal 220, substrate 230, and standing wave with peak intensity 240 may be configured the same as such elements having the same names and described with respect to system 100.

Substrate 230 may be at least partially transparent to at least one wavelength that is contained within input wave 210. Examples of substrate 230 include sapphire, silicon on sapphire, silicon (transparent to some wavelengths of infrared light), wood (transparent to certain microwave frequencies) or any number of other materials for which a wavelength can be found for which the material is at least partially transparent, as recognized by one having ordinary skill in the art.

As an example, second photonic crystal 250 may be configured to reflect waves with no transverse spatial components parallel to a first surface 252 of second photonic crystal 250, and to pass waves composed of spatial components that are parallel to first surface 252.

One difference between system 100 and system 200 is the replacement of the second at least partially reflective surface or surfaces, comprised within or on the surface of substrate 140 or surface 142, which may or may not be capable of perfectly reflecting the flat phase front without distorting it, with a second photonic crystal 250. This allows for further reinforcement of the flat wavefront by passing the perpendicular modes and reflecting the parallel phase front components. This will help to correct any distortions caused by going through substrate 230 and layer 232.

Peak intensity 240 of the standing wave between second photonic crystal 250 and first photonic crystal 220 may also vary within this region also known as optical cavity 212. For example, in some embodiments, peak intensity 240 of the standing wave may be located proximate to substrate 230. In other embodiments, peak intensity 240 of the standing wave may be located within optical cavity 212 a calculated distance from substrate 230. In other embodiments, peak intensity 240 of the standing wave may be located within substrate 230 or surface 232. Still in other embodiments, peak intensity 240 of the standing wave may vary in relation to the surface of the substrate 230. As an example, if the wavelength of input wave 210 is varied, peak intensity 240 of the standing wave in relation to the surface of substrate 230 will also vary.

In other embodiments of system 200, the location of peak intensity 240 of the standing wave within optical cavity may be tuned. For example, such tuning may occur by shifting the wavelength of input wave 210. As another example, such tuning may occur by altering the characteristics of photonic crystal 220 and/or 250 by an external field acting as a controlling field, such as light at a different frequency from that comprising input wave 210 or another an electromagnetic field, electric field, etc.

Additionally, in come embodiments, substrate 230 may comprise gaps or be at least partially non-contiguous. One or more of these peak intensity 240 locations may be used to the purposes described herein. For example, substrate 230 may comprise a second backside layer to be flattened in the same manner. In another embodiment, substrate 230 may contain multiple surfaces to be flattened, perhaps separated by gas or liquid material that might be used in the chemical reaction sequence.

Figure 4:
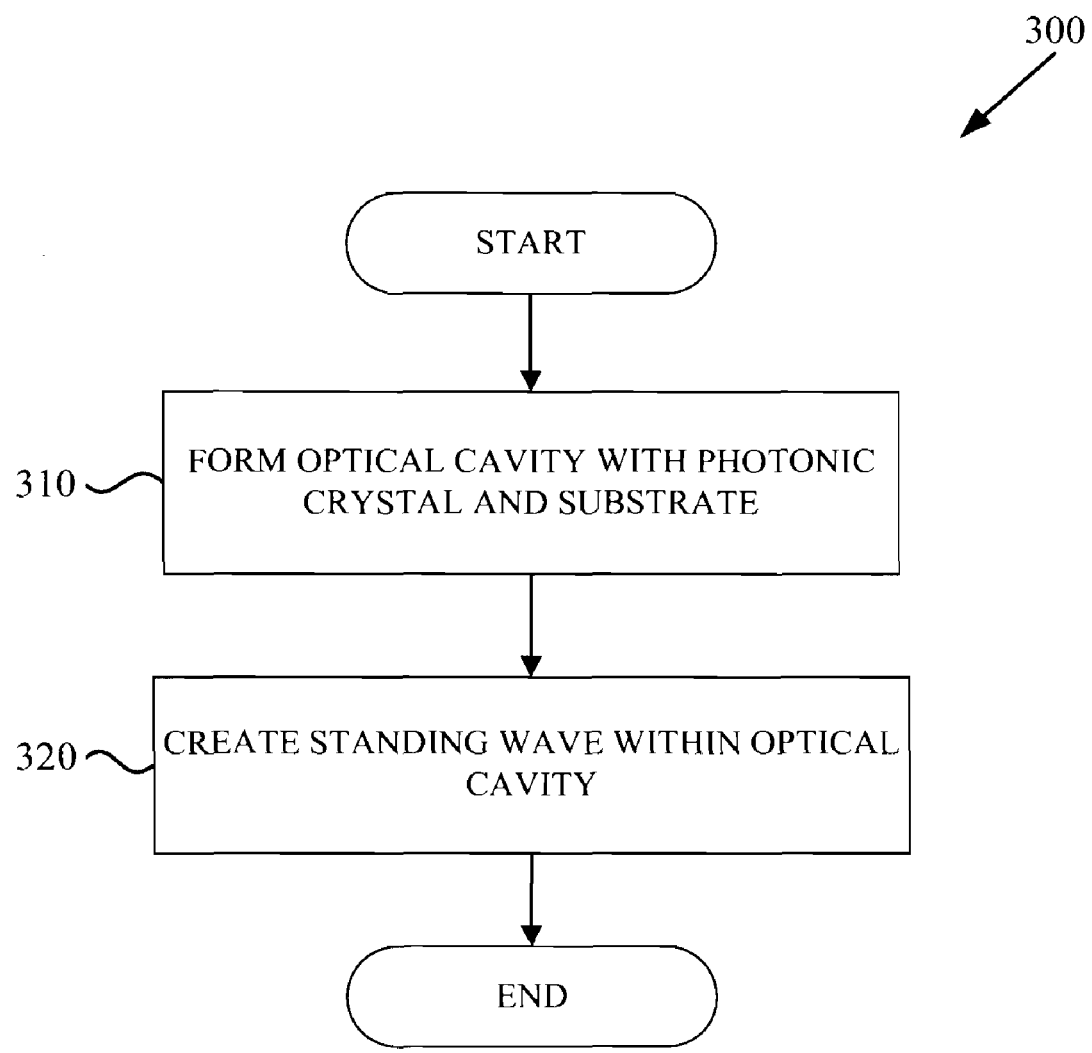
FIGS. 4-8 show flowcharts of methods in accordance with the System and Method for Creating a Flat Wavefront Using a Photonic Crystal.

FIG. 4 shows a flowchart of an embodiment of a method 300 for use with the System and Method for Creating a Flat Wavefront Using a Photonic Crystal. For illustration purposes, method 300 will be discussed with reference to system 100 discussed herein. Method 300 may begin at step 310, which involves forming an optical cavity 130 by positioning a photonic crystal 120 a predetermined distance from a substrate 140. Method 300 may then proceed to step 320, which involves creating, within optical cavity 130, a standing wave 150 having a substantially flat wavefront. A substantially flat wavefront may be defined as a wavefront with a roughness less than approximately the wavelength of the wavefront used to illuminate photonic crystal, or alternatively, in some embodiments, the periodicity of the photonic crystal itself.

Figure 5:
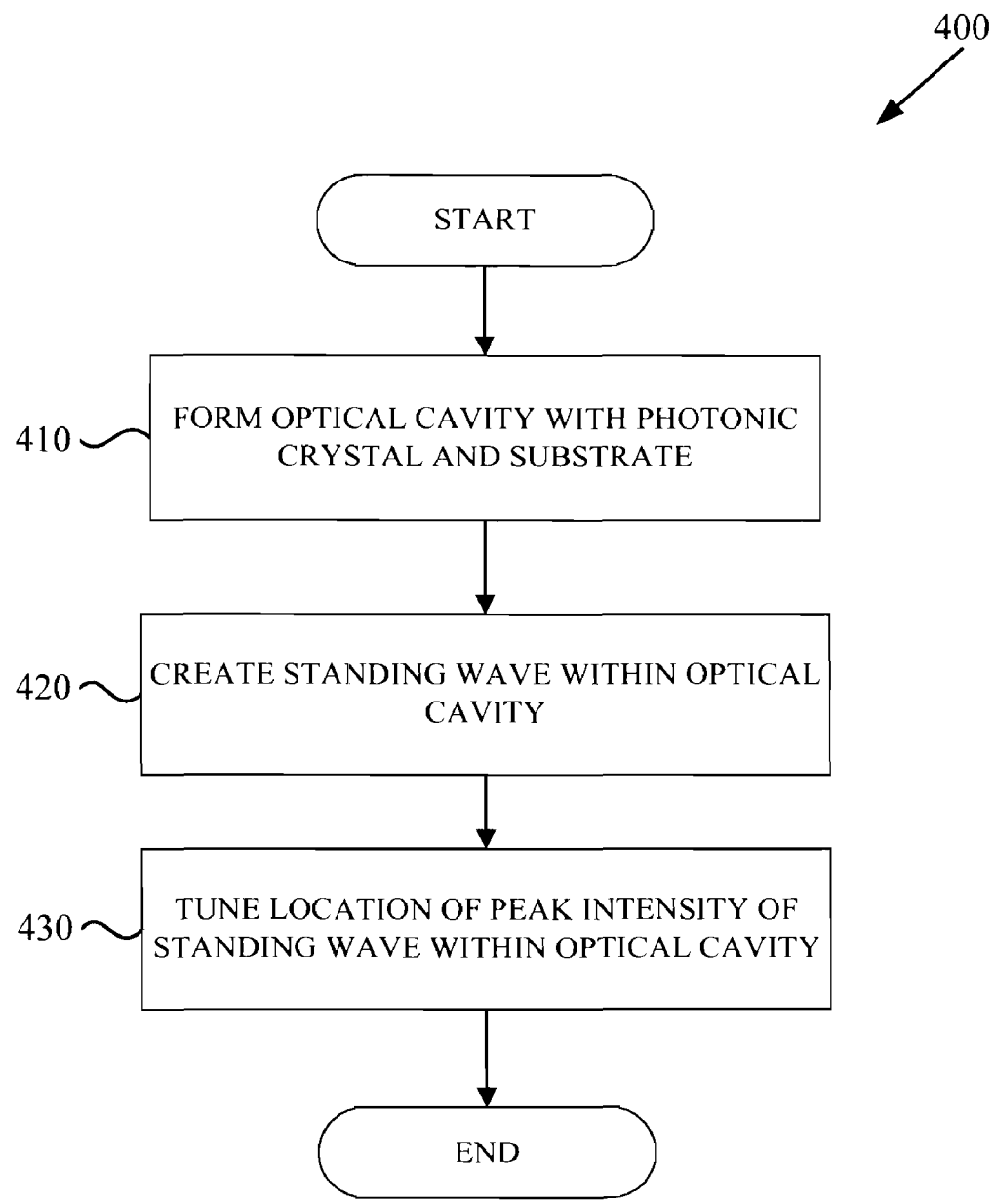

FIG. 5 shows a flowchart of an embodiment of a method 400 for use with the System and Method for Creating a Flat Wavefront Using a Photonic Crystal. For illustration purposes, method 400 will be discussed with reference to system 100 discussed herein with respect to FIG. 2. Method 400 may begin at step 410, which involves forming an optical cavity 130 by positioning a photonic crystal 120 a predetermined distance from a substrate 140. Method 400 may then proceed to step 420, which involves creating, within optical cavity 130, a standing wave 150 having a substantially flat wavefront. Step 430 may then involve tuning the location of the peak intensity of standing wave 150 within optical cavity 130. As described previously, such tuning may occur by shifting the wavelength of input wave 110 or by altering the characteristics of photonic crystal 120 by an external field acting as a controlling field, such as light at a different frequency from that comprising input wave 110 or another an electromagnetic field, electric field, etc.

Figure 6:
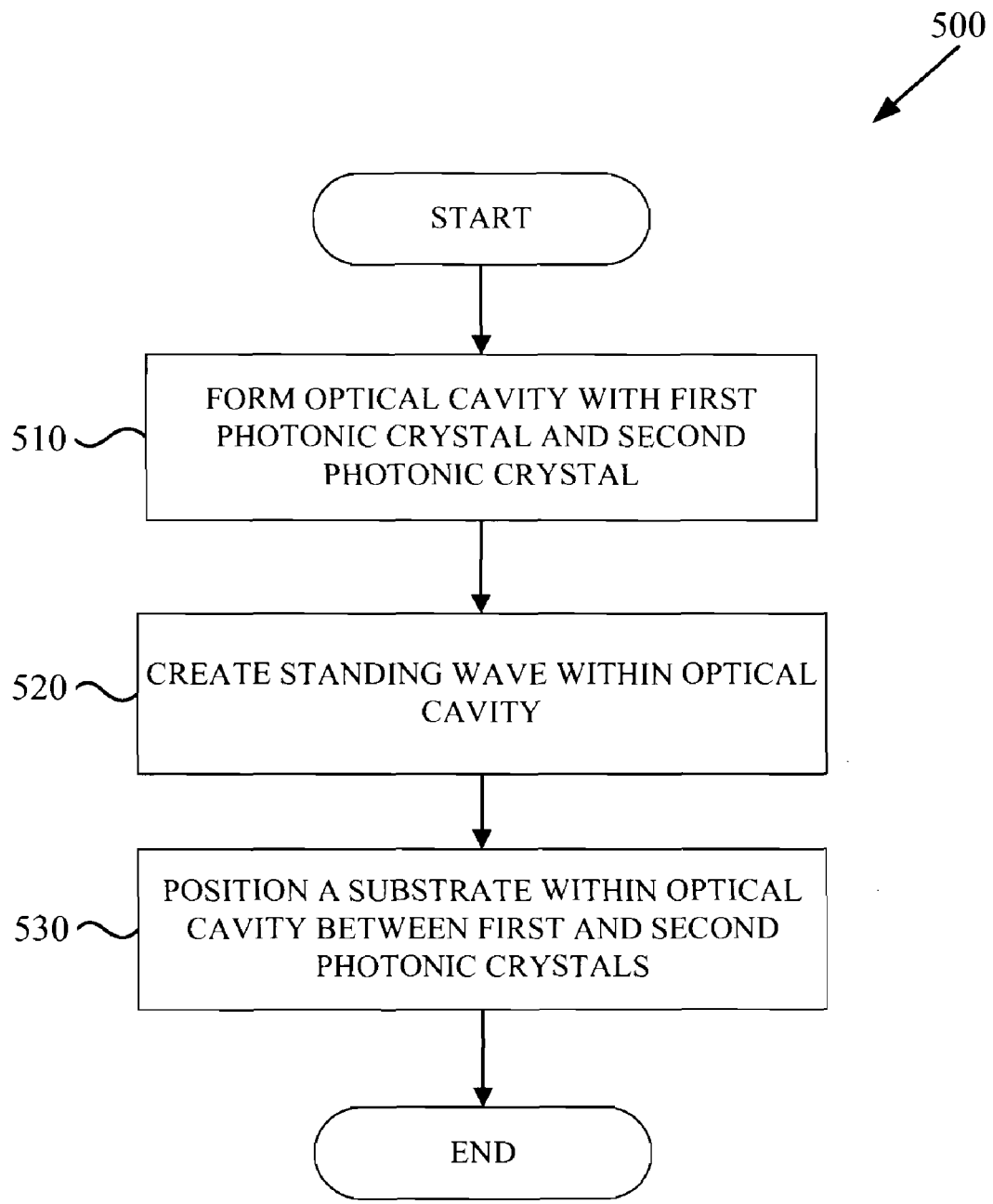

FIG. 6 shows a flowchart of an embodiment of a method 500 for use with the System and Method for Creating a Flat Wavefront Using a Photonic Crystal. For illustration purposes, method 500 will be discussed with reference to system 200 discussed herein with respect to FIG. 3. Method 500 may begin at step 510, which involves forming an optical cavity 212 by positioning a first photonic crystal 220 a predetermined distance from a second photonic crystal 250. Method 500 may then proceed to step 520, which involves creating, within optical cavity 212, at least one standing wave 240 having a substantially flat wavefront. Next, step 530 may involve positioning a substrate 230 between first and second photonic crystals (220 and 250).

Figure 7:
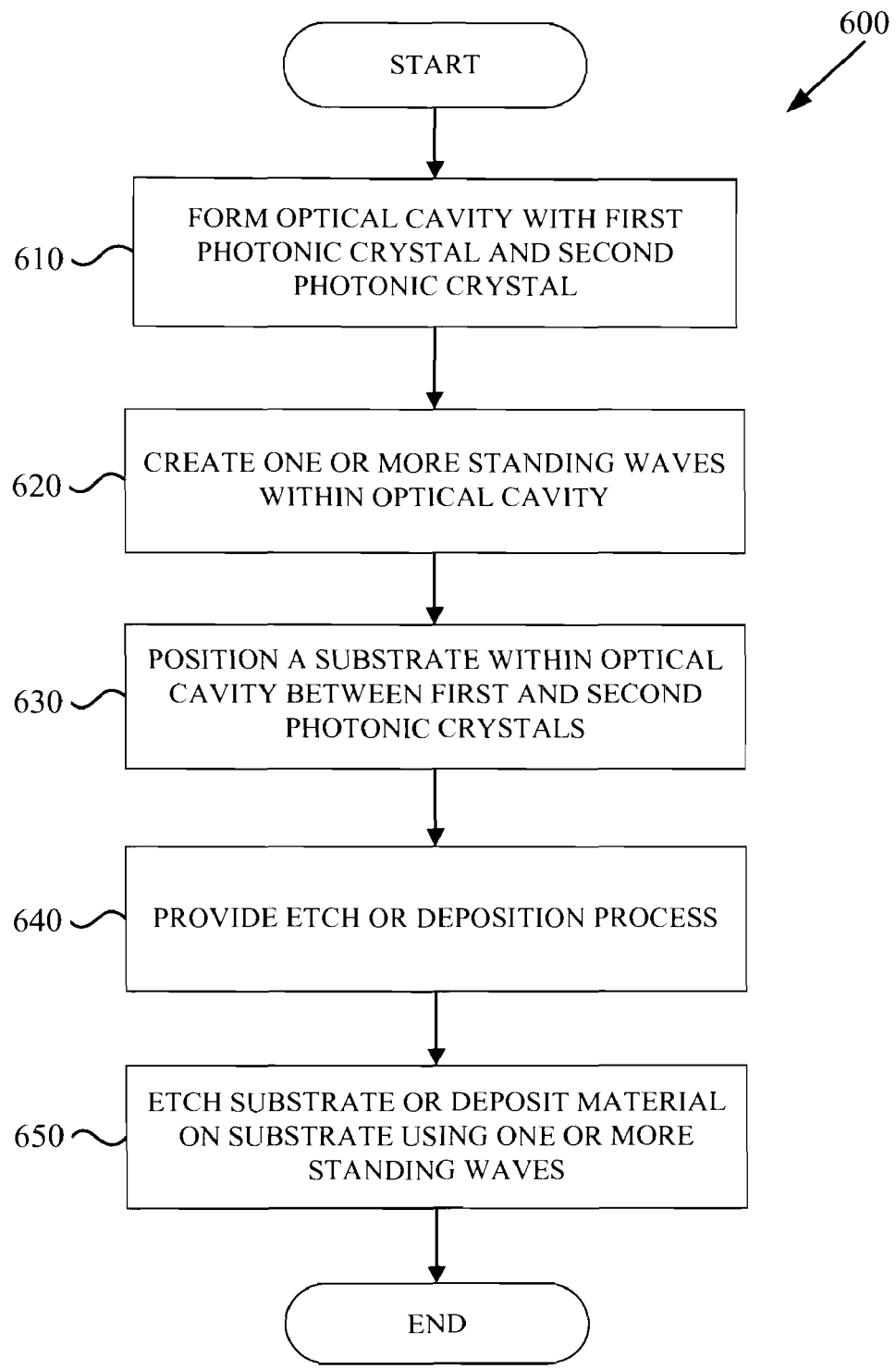

FIG. 7 shows a flowchart of an embodiment of a method 600 for use with the System and Method for Creating a Flat Wavefront Using a Photonic Crystal. For illustration purposes, method 600 will be discussed with reference to system 200 discussed herein with respect to FIG. 3. The etch or deposition processes described within method 600 may be performed in an ultra-clean environment, eliminating much of the contamination problems seen in typical wafer processing methods.

Method 600 may begin at step 610, which involves forming an optical cavity 212 by positioning a first photonic crystal 220 a distance from a second photonic crystal 250. In some embodiments, optical cavity 212 may be formed by positioning a photonic crystal a distance from a substrate (see FIG. 2A). Method 600 may then proceed to step 620, which involves creating, within optical cavity 212, one or more standing waves 240 having a substantially flat wavefront. Step 630 then involves positioning a substrate 230 within optical cavity 212 between the first photonic crystal 220 and second photonic crystal 250. In embodiments wherein the optical cavity is formed between a photonic crystal and a substrate, step 630 may be omitted. Method 600 may proceed to step 640.

Step 640 involves providing an etch or deposition process. As an example, the etch process may be an optically induced etch process. The deposition process may be provided to add material to the surface of the substrate. Step 650 involves modifying the surface 232 of substrate 230 using one or more standing waves 240. This modification may include changes such as etching or depositing material on or within substrate 230, as well as chemical or other reactive changes that may occur on or within substrate 230.

The optically induced etch process (or deposition) process etches (or deposits material on) the surface 232 of substrate 230 at a rate proportional to or as a function (as an example, it could be a non-linear function) of the optical intensity of the standing wave within optical cavity 212. As an example, the design of the cavity 212 could cause the standing wave to have a higher intensity just above the median surface height than at the median surface height. In this case, a raised section of the surface 232 of substrate 230 will be etched (or have material deposited) at a faster rate than areas at the median height of surface 232, resulting in a flattening or smoothening of (or, in the case of deposition, building up of) surface 232.

Figure 8:
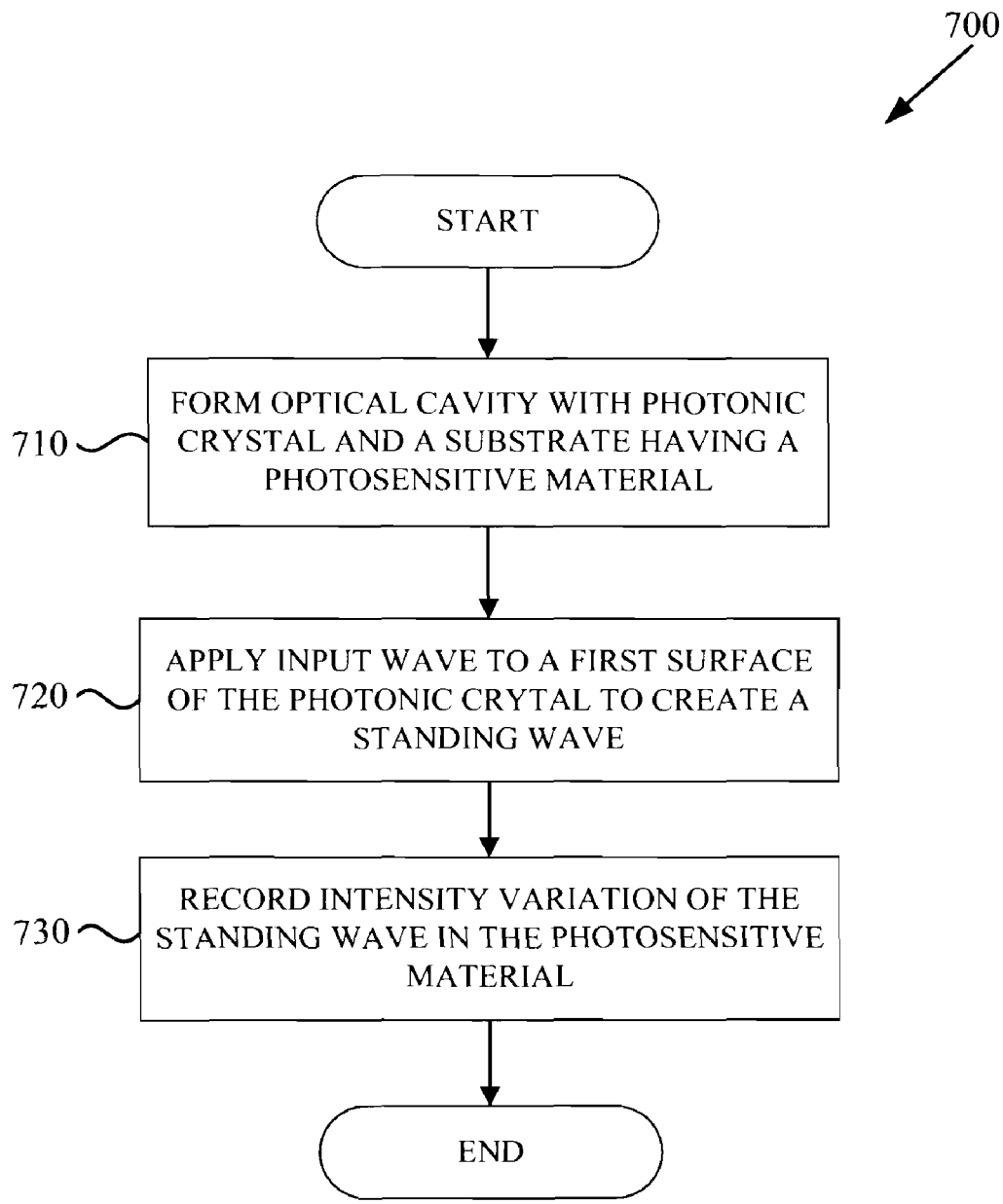

FIG. 8 shows a flowchart of an embodiment of a method 700 for use with the System and Method for Creating a Flat Wavefront Using a Photonic Crystal. For illustration purposes, method 700 will be discussed with reference to system 100 discussed herein. Method 700 may begin at step 710, which involves forming an optical cavity 130 by positioning a photonic crystal 120 a predetermined distance from a substrate 140 having a photosensitive material. In some embodiments, the photosensitive material, such as photoresist, may be coated on, contained within, or otherwise affiliated with either a portion of, or, the entire surface 142 or substrate 140. In some embodiments, surface 142 or substrate 140 may itself comprise a photosensitive material.

Step 720 may then involve applying an input wave 110 to a first surface 122 of first photonic crystal 120 to create a standing wave. Method 700 may then proceed to step 730, which involves recording the intensity variation of the standing wave in the photosensitive material. The intensity variation may then be used for subsequent processes performed on the substrate such as etching or deposition.

It should be noted that in other embodiments of method 700, the optical cavity may be formed between a first photonic crystal a distance from a second photonic crystal (as shown in FIG. 3). In such embodiments, a substrate having a photosensitive material is positioned within the optical cavity and subject to the standing wave that is created within the optical cavity. The intensity variation of the standing wave may then be recorded in the photosensitive material.

Many modifications and variations of the System and Method for Creating a Flat Wavefront Using a Photonic Crystal are possible in light of the above description. Within the scope of the appended claims, the System and Method for Creating a Flat Wavefront Using a Photonic Crystal may be practiced otherwise than as specifically described. Further, the scope of the claims is not limited to the implementations and embodiments disclosed herein, but extends to other implementations and embodiments as may be contemplated by those having ordinary skill in the art.

We claim:

1. A method comprising the steps of:
   forming an optical cavity by positioning a photonic crystal a predetermined distance from a substrate; and
   creating, within the optical cavity, a standing wave having a substantially flat wavefront.

2. The method of claim 1, wherein the photonic crystal includes a surface coating that is at least partially reflective.

3. The method of claim 1, wherein the predetermined distance is such that a peak intensity of the standing wave is proximate to the surface of the substrate.

4. The method of claim 1, wherein the predetermined distance is such that a peak intensity of the standing wave is beneath the surface of the substrate.

5. The method of claim 1, wherein the predetermined distance is such that a peak intensity of the standing wave is a calculated distance from the surface of the substrate.

6. The method of claim 1, wherein a peak intensity of the standing wave varies in relation to the surface of the substrate.

7. The method of claim 1, wherein the step of creating a standing wave in the optical cavity comprises the step of applying an input wave to a first surface of the photonic crystal.

8. The method of claim 7, wherein the input wave is in a spectrum ranging from the approximately 500 nm to 10 cm.

9. The method of claim 1 further comprising the step of tuning the location of a peak intensity of the standing wave within the optical cavity.

10. The method of claim 9, wherein the location of the peak intensity of the standing wave within the optical cavity is tuned by shifting the wavelength of the input wave.

11. The method of claim 9, wherein the location of the peak intensity of the standing wave within the optical cavity is tuned by altering the characteristics of the photonic crystal by an external field.

12. The method of claim 1, wherein the photonic crystal includes a first surface and is configured to pass through the photonic crystal those spatial components perpendicular to the first surface and restrict those that are parallel to the first surface.

13. The method of claim 1, further comprising the step of positioning a second photonic crystal below the substrate, wherein the second photonic crystal is configured to reflect waves consisting of components perpendicular to a first surface of the photonic crystal and pass or absorb waves consisting of spatial components parallel to the first surface.

14. The method of claim 13, wherein the substrate is at least partially transparent.

15. The method of claim 1 further comprising the step of modifying the substrate using the standing wave.

16. The method of claim 15, wherein the step of modifying the substrate using the standing wave comprises the steps of:
   providing an etch process; and
   etching the substrate using the standing wave to create a substantially flat surface.

17. The method of claim 16, wherein the etching rate is a function of the intensity of the wave in the optical cavity.

18. The method of claim 15, wherein the step of modifying the substrate using the standing wave comprises the steps of:
   providing a deposition process; and
   depositing material on the substrate using the standing wave to create a substantially flat surface.

19. The method of claim 18, wherein the deposition rate is a function of the intensity of the standing wave.

20. The method of claim 1, wherein the substantially flat wavefront is a wavefront having a curvature or roughness less than the wavelength of the wavefront itself.

21. The method of claim 1 further comprising the step of adjusting the location of the peak intensity in the optical cavity by altering the predetermined distance.

22. The method of claim 1, wherein the substrate includes a photosensitive material, wherein the method further comprises the steps of:
   applying an input wave to a first surface of the photonic crystal; and
   recording the intensity variation of the standing wave in the photosensitive material.

23. A system comprising:
   an optical cavity formed by a first photonic crystal positioned a predetermined distance from a second photonic crystal; and
   a standing wave within the optical cavity, the standing wave having a substantially flat wavefront.

24. The system of claim 23, wherein the first photonic crystal includes a surface coating that is at least partially reflective.

25. The system of claim 23, wherein the second photonic crystal includes a surface coating that is at least partially reflective.

26. The system of claim 23 further comprising a substrate located within the optical cavity, wherein the substrate is configured to be modified based upon the intensity of the standing wave.

27. The system of claim 26, wherein the substrate is configured to be modified by etching.

28. The system of claim 26, wherein the substrate is configured to be modified by deposition of material on or within the substrate.

29. The system of claim 26, wherein the substrate is configured to be modified by exposure of a photosensitive material.

30. The system of claim 26 further comprising a material located within the optical cavity configured to react with the substrate based upon the standing wave intensity and carry reaction products to and from the substrate.

\* \* \* \* \*